US00RE41510E

(19) United States
(12) Reissued Patent
Hong et al.

(10) Patent Number: US RE41,510 E
(45) Date of Reissued Patent: Aug. 17, 2010

(54) LEAD FRAME

(75) Inventors: Heng Wan Hong, Singapore (SG); Tian Siang Yip, Singapore (SG); Joo Hong Tan, Singapore (SG); Choon Muah Lee, Singapore (SG); Liang Kng Ian Koh, Singapore (SG)

(73) Assignee: Infineon Technologies AG, Munich (DE)

(21) Appl. No.: 12/408,576

(22) Filed: Mar. 20, 2009

Related U.S. Patent Documents

Reissue of:
(64) Patent No.: 7,193,298
Issued: Mar. 20, 2007
Appl. No.: 10/903,495
Filed: Jul. 30, 2004

U.S. Applications:

(63) Continuation of application No. PCT/SG02/00014, filed on Feb. 1, 2002.

(51) Int. Cl.
*H01L 23/495* (2006.01)
*H01L 23/28* (2006.01)
*H01L 23/48* (2006.01)
*H01L 23/52* (2006.01)

(52) U.S. Cl. ..... 257/666; 257/676; 257/784; 257/787; 257/E23.031

(58) Field of Classification Search ..... 257/666, 257/676, 784, 787, E23.031
See application file for complete search history.

(56) References Cited

U.S. PATENT DOCUMENTS

| | | | | | |
|---|---|---|---|---|---|
| 5,329,705 | A | * | 7/1994 | Grim et al. | 36/88 |
| 5,767,566 | A | * | 6/1998 | Suda | 257/666 |
| 5,977,615 | A | * | 11/1999 | Yamaguchi et al. | 257/666 |
| 6,150,709 | A | * | 11/2000 | Shin et al. | 257/666 |
| 6,225,146 | B1 | * | 5/2001 | Yamaguchi et al. | 438/123 |
| 6,642,609 | B1 | * | 11/2003 | Minamio et al. | 257/666 |
| 6,713,322 | B2 | * | 3/2004 | Lee | 438/123 |
| 2002/0140061 | A1 | * | 10/2002 | Lee | 257/666 |

FOREIGN PATENT DOCUMENTS

| | | |
|---|---|---|
| JP | 03184366 | 8/1991 |
| JP | 03289162 | 12/1991 |
| JP | 06252333 | 9/1994 |
| JP | 09219488 | 8/1997 |
| JP | 10242363 | 9/1998 |

* cited by examiner

*Primary Examiner*—Nitin Parekh
(74) *Attorney, Agent, or Firm*—Slater & Matsil, L.L.P.

(57) ABSTRACT

A lead frame (1) has a first portion (2) adapted to have a semiconductor device (10) mounted thereon and a second portion (3) including a main member (5), a number of first contact members (6) and a number of second contact members (7). The first and second contact members (6, 7) depend from the main member (5). The second portion (3) at least partially surrounds the first portion (6). The first contact members (6) extend form the main member (5) in a direction away for the first portion (2) and the second contact members (7) extend from the main member (5) in a direction towards the first portion (2).

29 Claims, 4 Drawing Sheets

LEAD FRAME

Matter enclosed in heavy brackets [ ] appears in the original patent but forms no part of this reissue specification; matter printed in italics indicates the additions made by reissue.

This application is a continuation of co-pending International Application No. PCT/SG02/00014, filed Feb. 1, 2002, which designated the United States and was published in English.

TECHNICAL FIELD

The invention relates to a lead frame, and especially a lead frame for mounting a semiconductor device thereon.

BACKGROUND

Due to higher system integration, there is a trend to increase the number of input/output pins (i.e., pin count) on integrated circuit packages. At the same time, there is also a desire to reduce the package size. However, the increase in pin count places a limitation on the reduction of the package size, unless the pitch of the pins is reduced. Reducing the pitch of the pins leads to more complication during fabrication as it requires processes, such as stamping tool fabrication, dambar cut process, testing and surface mount technology to be more accurate.

Therefore, there is a conflict between increasing system integration, which results in a higher pin count, and reducing the size of the integrated circuit package.

SUMMARY OF THE INVENTION

In accordance with a first aspect of the present invention, there is provided a lead frame comprising a first portion adapted to have a semiconductor device mounted thereon and a second portion comprising a main member, a number of first contact members and a number of second contact members, the first and second contact members depending from the main member, the second portion at least partially encircling the first portion and the first contact members extending from the main member in a direction away from the first portion and the second contact members extending from the main member in a direction towards the first portion.

An advantage of the invention is that by having contact members which extend both towards and away from the first portion, it is possible to increase the number of contact members for a given package size without requiring a decrease in the pitch of the contact members.

Preferably, the ends of the first and second contact members remote from the main member are substantially co-planar.

Typically, the first portion may also be co-planar with the remote ends of the first and second contact members.

Preferably, the first contact members are offset along the main member from the second contact members.

Typically, the spacing between the first contact members adjacent the main member is greater than the width of the second contact members adjacent to the main member.

Preferably, the spacing between the second contact members adjacent to the main member is greater than the width of the first contact members adjacent to the main member.

Typically, the second portion further comprises a bond member for each of the first contact members, the bond members extending from the main member in a direction towards the first portion. Typically, the bond members are in line with the first contact members and preferably each of the second contact members is separated from its adjacent second contact members by a bond member.

In accordance with a second aspect of the present invention, there is provided a semiconductor device package comprising a substrate, a semiconductor device mounted on the substrate and a number of electrical interconnects electrically coupling electrical contacts on the semiconductor device to contact members on the substrate, the semiconductor device and the electrical interconnects being encapsulated in an electrically insulating material, and the contact members comprising a number of contact members extending from the encapsulation material and a number of second contact members located on a surface of the encapsulating material.

Preferably, the substrate is a lead frame in accordance with the first aspect of the present invention.

Preferably, the second contact members located on the surface of the encapsulating material are substantially co-planar with the ends of the first contact members extending from the encapsulating material.

Preferably, the second contact members are substantially flush with the surface of the encapsulating material. However, it is possible that they may protrude from the surface.

Typically, the surface of the encapsulating material on which the second electrical contact members are located is the surface of the encapsulating material adjacent to the underside of the substrate, which is the side opposite to the side on which the semiconductor device is mounted.

In one example of the invention, the underside of the substrate is exposed on the same surface of the encapsulating material on which the second electrical contact members are exposed, and typically, the exposed underside of the substrate is substantially co-planar with the second electrical contact members.

BRIEF DESCRIPTION OF THE DRAWINGS

An example of a lead frame in accordance with the present invention will now be described with reference to the accompanying drawings, in which.

DETAILED DESCRIPTION OF ILLUSTRATIVE EMBODIMENTS

Figure 1:
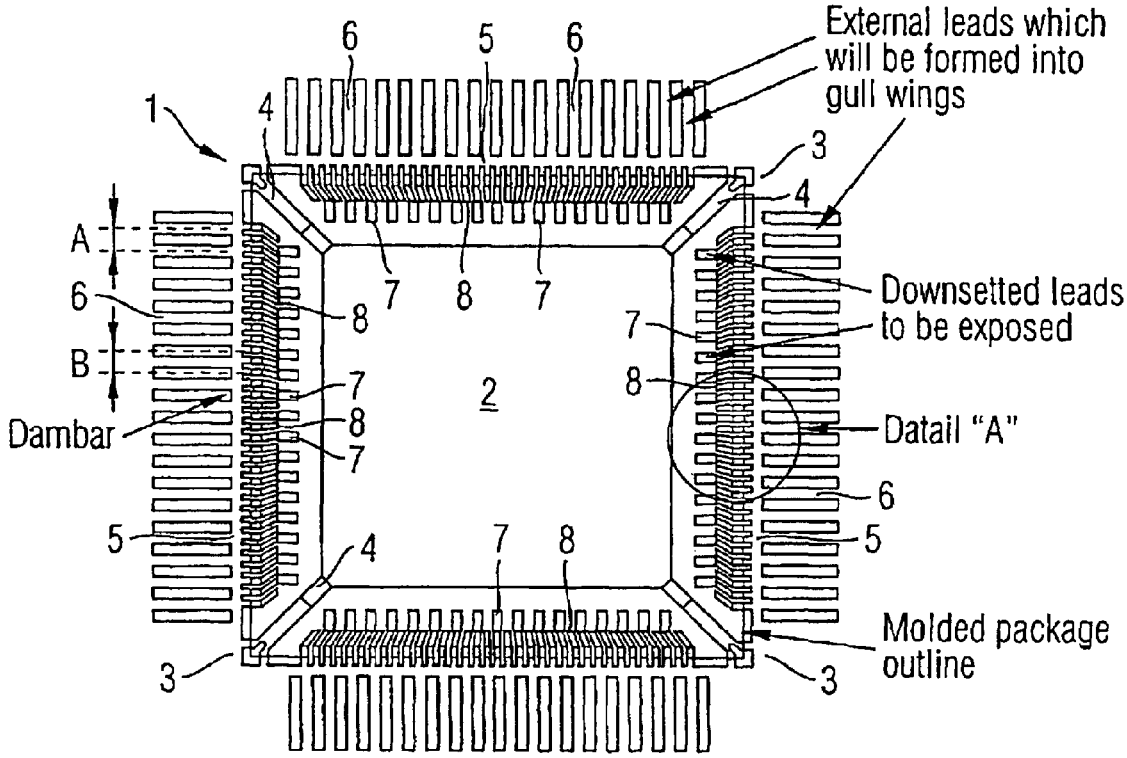
FIG. 1 is plan view of part of a lead frame.

FIG. 1 shows a part of a lead frame 1, which includes a die pad 2 and a contact pin portion 3, which surrounds the die pad 2. The die pad 2 is connected to the contact pin portion 3 by supports 4.

Figure 2:
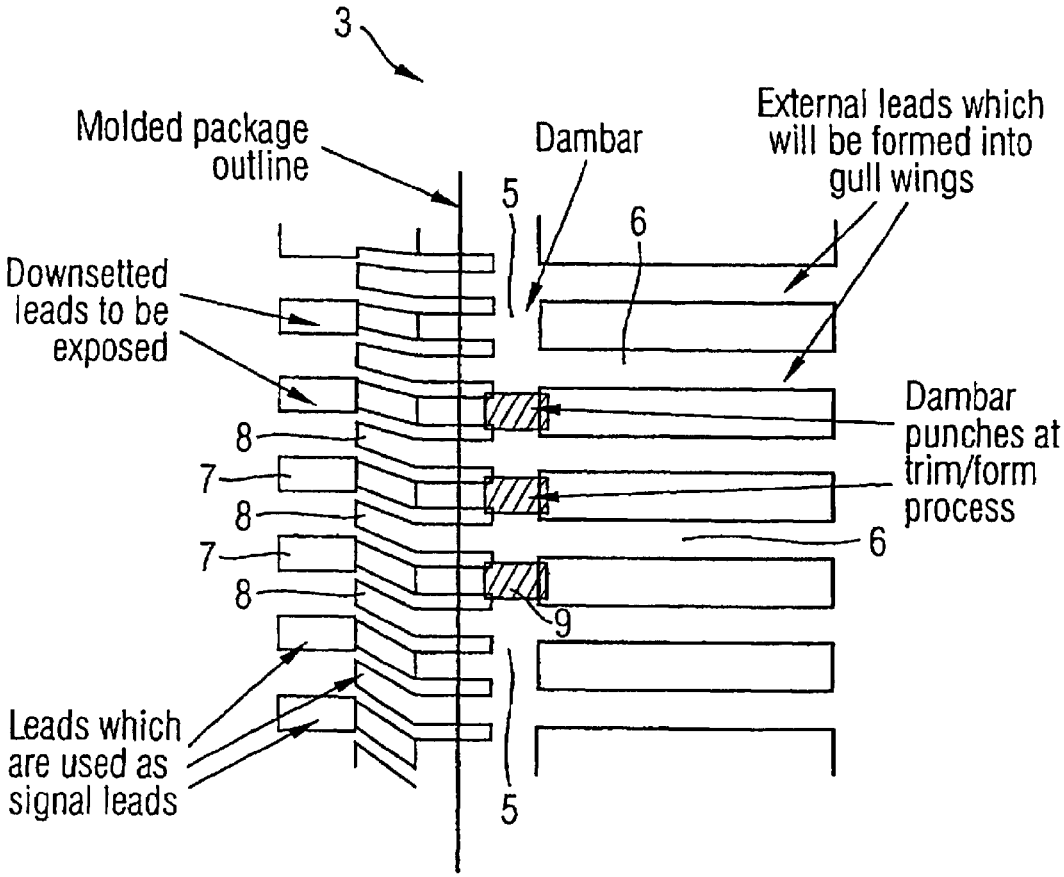
FIG. 2 is an enlarged view of detail "A" of FIG. 1.
Figure 3:
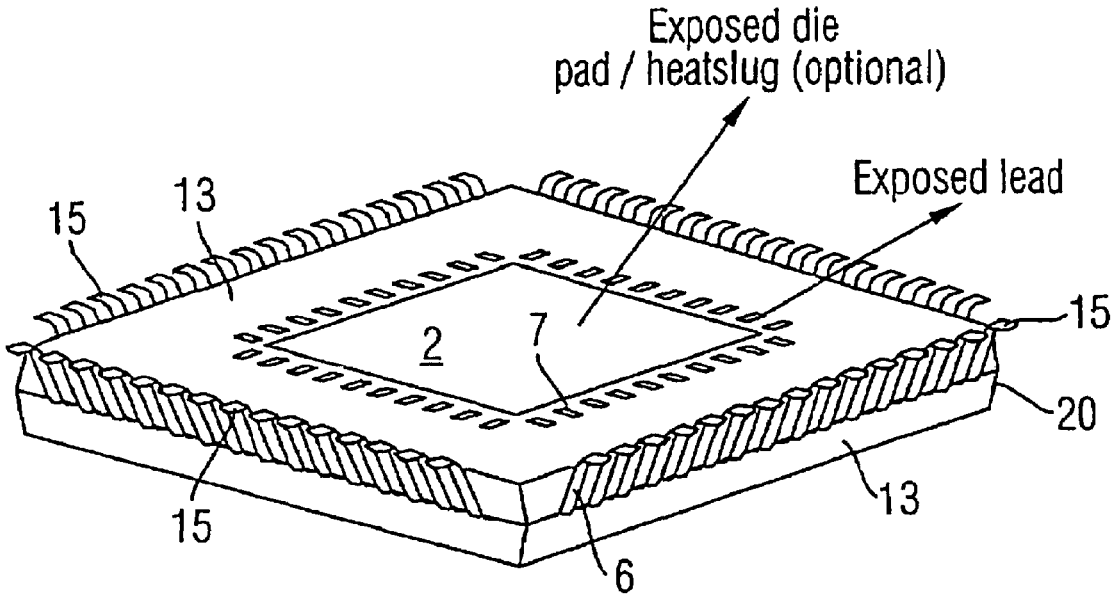
FIG. 3 is a perspective view of an upside down packaged semiconductor device.

The contact pin portion 3 comprises a central section 5 commonly known as a dambar, which extends substantially parallel to each of the sides of the die pad 2. The dambar 5 has a set of first electrical contacts 6 extending from the dambar 5 in a direction away from the die pad 2. In addition, there are a set of second electrical contacts 7 extending from the dambar 5 in a direction towards the die pad 2. Located between each pair of adjacent second electrical contacts 7 is a bond member 8. The arrangement of the first and second contact members and the bond members 8 on the dambar 5 is shown in more detail in FIG. 2. The bond members 8 are arranged to be in-line with the first electrical contacts 6, and the second electrical contacts 7 are offset from the first electrical contacts 6.

Figure 4:
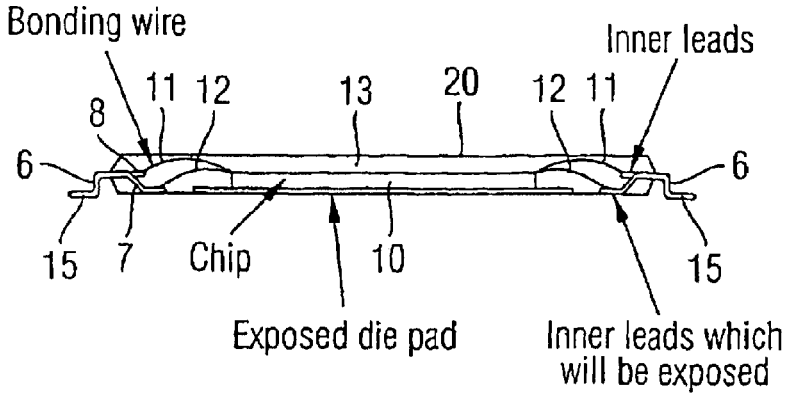
FIG. 4 is a cross-sectional view of the packaged semiconductor device.

In use, a semiconductor chip 10 is attached to the die pad 2 using a conventional die attach adhesive (see FIG. 4). Wire bonds 11, 12 are then formed, which extend from contact pads (not shown) on the chip 10 to the bond members 8 and the second contact members 7, respectively. An encapsulation process is then carried out to mold an electrically insulating encapsulating material 13 around the die pad 2, the chip 10, the wire bonds 11, 12, the second contacts 7 and the bond members 8.

After the encapsulation process, portions 9 of the dambar 5 are punched out during a trim/form process. It can be seen from FIG. 2 that after the portions 9 have been punched out of the dambar 5, the first contacts 6 are still connected to the bond members 8 but are electrically isolated from the second contacts 7, and the first contacts 6, bond members 8 and second contacts 7 are all held in their respective positions by the encapsulating material 13.

A finished molded semiconductor device package 20, which in this case is a quad flat package (QFP), is shown in FIGS. 3 to 7. The underside of the die pad 2 and the ends of the second contacts 7, which are remote from the dambar 5, are exposed through the surface of the encapsulating material 13.

The first contacts 6 extend from the sides of the packaged device 20 in the same way as the pins on a conventional lead frame based package.

Figure 6:
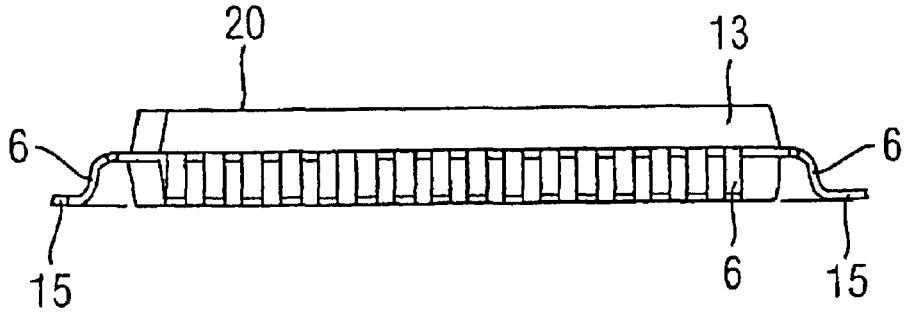
FIG. 6 is a side view of the packaged semiconductor device.
Figure 5:
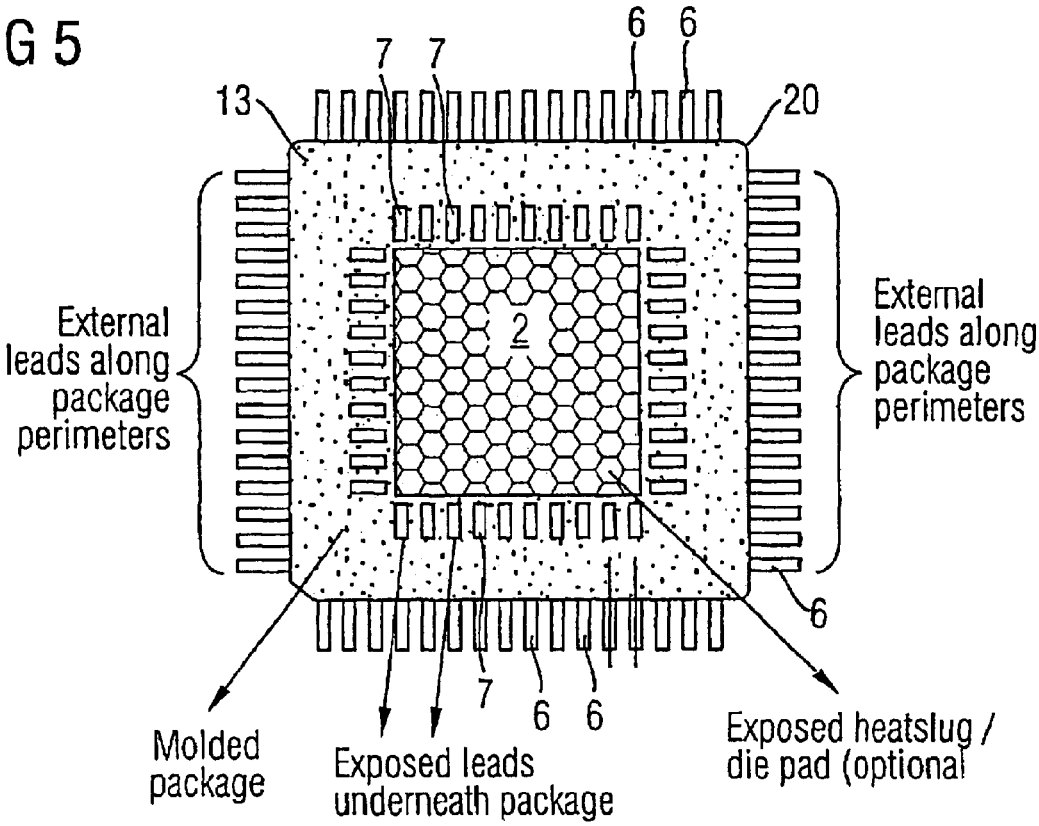
FIG. 5 is a bottom view of the packaged semiconductor device.
Figure 7:
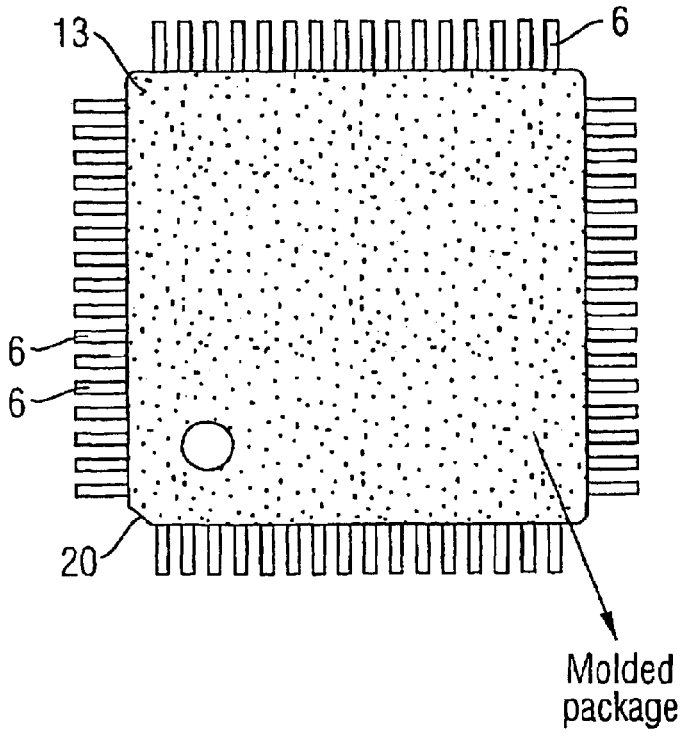
FIG. 7 is a plan view of the packaged semiconductor device.

It will also be noted from FIGS. 4 and 6 that ends 15 of the first contacts 6 are substantially co-planar with the exposed ends of the second contacts 7 and with the underside of the die pad 2. This helps to ensured that when the packaged device 20 is connected to a circuit board, the first contacts 6, the second contacts 7 and the underside of the die pad 2 all contact the circuit board.

The exposed underside of the die pad 2 is an optional feature and it is possible that the lead frame and the mold for molding the encapsulating material 13 could be configured such that the underside of the die pad 2 is not exposed but is covered with encapsulating material 13. In addition, it may be desirable to perform the molding process such that the exposed ends of the second contacts 7 and (optionally) the underside of the die pad 2 protrude from the surface of the encapsulating material 13 instead of being flush with the surface of the encapsulating material 13.

In the lead frame 1, the pitch of the first contact members 6 is defined as "A" and the pitch of the second contact members 7 is defined as "B" (see FIG. 1). Table 1 below shows typical pin counts for a package according to the invention compared with a standard QFP for different body sizes. It can be seen from Table 1 that the invention enables a QFP of a given size to have either a higher pin count for a similar pin pitch, a greater pin pitch for a similar pin count or a combination of both.

Accordingly, the invention has the advantage of permitting a higher pin count and/or a larger pin pitch for a given package size.

TABLE 1

| | Package of Invention | | | Standard QFP | |
|---|---|---|---|---|---|
| Body Size (mm) | Total pin count available | External lead pitch A (mm) | Exposed lead pitch B (mm) | Total pin count available | Lead pitch A (mm) |
| 14 × 14 | — | — | — | 64 | 0.8 |
| 14 × 14 | — | — | — | 80 | 0.65 |
| 14 × 14 | 104 | 0.8 | 0.8 | 100 | 0.5 |
| 14 × 14 | 120 | 0.65 | 0.8 | 120 | 0.4 |
| 10 × 10 | 64 | 0.8 | 0.8 | 44 | 0.8 |
| 10 × 10 | 72 | 0.65 | 0.8 | 52 | 0.65 |
| 10 × 10 | — | — | — | 64 | 0.5 |

What is claimed is:

1. A lead frame comprising a first portion adapted to have a semiconductor device mounted thereon and a second portion comprising a main member, a first set of electrical contact members and a second set of electrical contact members, the contact members of the first and second sets extending in directions away from the main member, the second portion at least partially surrounding the first portion, wherein the first set of electrical contact members extend from the main member in a direction away [train] *from* the first portion and the second set of electrical contact members extend from the main member in a direction towards the first portion, and wherein the first set of electrical contact members is electrically isolated from the second set of electrical contact members.

2. A lead frame according to claim 1, wherein the ends of the first and second sets of electrical contact members remote from the main member are substantially coplanar.

3. A lead frame according to claim 1, wherein the first portion is substantially co-planar with the remote ends of the second set of electrical contact members.

4. A lead frame according to claim 1, wherein the first set of electrical contact members are offset along the main member from the second set of electrical contact members.

5. A lead frame according to claim 1, wherein the spacing between the first set of electrical contact members adjacent the main member is greater than the width of the second set of electrical contact members adjacent to the main member.

6. A lead frame according to claim 1, wherein the spacing between the second set of electrical contact members adjacent to the main member is greater than the width of the first set of electrical contact members adjacent to the main member.

7. A lead frame according to claim 1, wherein the second portion further comprises a bond member for each of the first set of electrical contact members.

8. A lead frame according to claim 7, wherein the bond members extend from the main member in a direction towards the first portion.

9. A lead frame according to claim 8, wherein the bond members are in line with the first set of electrical contact members.

10. A lead frame according to claim 8, wherein each of the second set of electrical contact members is separated from its adjacent second set of electrical contact members by a bond member.

11. A semiconductor device package comprising a substrate, a semiconductor device mounted on the substrate and a number of electrical interconnects electrically coupling electrical contacts on the semiconductor device to contact members on the substrate, the semiconductor device and the electrical interconnects being encapsulated in an electrically insulating material, and the contact members comprising a first set of electrical contact members extending from the encapsulation material, and a second set of electrical contact members located on a surface of the encapsulating material, wherein the second set of electrical contact members have a different pitch as compared to the first set of electrical contact members, and wherein the first set of contact members is electrically isolated from the second set of contact members.

12. A semiconductor device package according to claim 11, wherein the substrate comprises a lead frame having a first portion having the semiconductor device mounted thereon and a second portion comprising a main member, wherein the electrical contact members of the first and second sets depend from the main member, the second portion at least partially surrounding the first portion, wherein the first set of electrical contact members extend from the main member in a direction away from the first portion and the second set of electrical contact members extend from the main member in a direction towards the first portion.

13. A semiconductor device package according to claim 11, wherein the second set of electrical contact members located on the surface of the encapsulating material are substantially co-planar with the ends of the first set of electrical contact members extending from the encapsulating material.

14. A semiconductor device package according to claim 11, wherein the second set of electrical contact members are substantially flush with the surface of the encapsulating material.

15. A semiconductor device package according to claim 11, wherein the surface of the encapsulating material on which the second set of electrical contact members are located is the surface of the encapsulating material adjacent to the underside of the substrate, which is the side opposite to the side on which the semiconductor device is mounted.

16. A semiconductor device package according to claim 15, wherein the underside of the substrate is exposed on the same surface of the encapsulating material on which the second set of electrical contact members are exposed.

17. A semiconductor device package according to claim 16 wherein the exposed underside at the substrate is substantially co-planar with the second set of electrical contact members.

*18. A semiconductor component comprising:*

*a die pad adapted to have a semiconductor device mounted thereon;*

*a first set of electrical contact members, wherein the first set of electrical contact members comprises a first set of gull wing formed electrical contact members; and*

*a second set of electrical contact members;*

*wherein the contact members of the first and second sets extend in directions away from a region;*

*wherein the first set of electrical contact members extends from the region in a direction away from the die pad and the second set of electrical contact members extends from the region in a direction towards the die pad;*

*wherein ends of the first set of electrical contact members in the direction away from the die pad and ends of the second set of electrical contact members in the direction towards the die pad are substantially coplanar; and*

*wherein the first set of electrical contact members is electrically isolated from the second set of electrical contact members.*

*19. The semiconductor component according to claim 18, wherein the die pad is substantially coplanar with the ends of the second set of electrical contact members in the direction towards the die pad.*

*20. The semiconductor component according to claim 18, wherein a spacing between the first set of electrical contact members is greater than a width of the second set of electrical contact members.*

*21. The semiconductor component according to claim 18, wherein a spacing between the second set of electrical contact members is greater than a width of the first set of electrical contact members.*

*22. The semiconductor component according to claim 18, further comprising a semiconductor device mounted to the die pad.*

*23. A semiconductor component comprising:*

*a die pad;*

*a first set of electrical contact members;*

*a second set of electrical contact members, the contact members of the first and second sets extending in directions away from a region, wherein the first set of electrical contact members extends from the region in a direction away from the die pad and the second set of electrical contact members extends from the region in a direction towards the die pad, and wherein the first set of electrical contact members is electrically isolated from the second set of electrical contact members;*

*a semiconductor device mounted to the die pad;*

*a plurality of electrical interconnects electrically coupling electrical contacts on the semiconductor device to contact members of the first set of electrical contact members and to contact members of the second set of electrical contact members; and*

*an electrically insulating material encapsulating the semiconductor device and the electrical interconnects, wherein ends of the first set of electrical contact members in the direction away from the die pad extend from the encapsulating material, and wherein ends of the second set of electrical contact members in the direction towards the die pad are exposed through a surface of the encapsulating material.*

*24. The semiconductor component according to claim 23, wherein an underside of the die pad and the ends of the second set of electrical contact members in the direction towards the die pad are exposed through the surface of the encapsulating material.*

*25. The semiconductor component according to claim 23, wherein the first set of electrical contact members is essentially gull wing formed.*

*26. The semiconductor component according to claim 23, wherein the ends of the first set of electrical contact members in the direction away from the die pad and the ends of the second set of electrical contact members in the direction towards the die pad are substantially coplanar.*

*27. The semiconductor component according to claim 23, wherein the ends of the second set of electrical contact members in the direction towards the die pad are substantially flush with the surface of the encapsulating material.*

*28. The semiconductor component according to claim 23, wherein an underside of the die pad is exposed on the same surface of the encapsulating material on which the second set of electrical contact members is exposed.*

*29. The semiconductor component according to claim 23, wherein the exposed ends of the second set of electrical contact members are substantially coplanar with the ends of the first set of electrical contact members in the direction away from the die pad.*

* * * * *